(12) United States Patent
Lin

(10) Patent No.: US 6,620,689 B2
(45) Date of Patent: Sep. 16, 2003

(54) METHOD OF FABRICATING A FLASH MEMORY CELL USING ANGLED IMPLANT

(75) Inventor: Shian-Jyh Lin, Chiai Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/147,236

(22) Filed: May 15, 2002

(65) Prior Publication Data

US 2003/0064564 A1 Apr. 3, 2003

(30) Foreign Application Priority Data

Sep. 27, 2001 (TW) .................................. 90123899 A

(51) Int. Cl.[7] .......................................... H01L 21/8247
(52) U.S. Cl. ..................... 438/266; 438/302; 438/532
(58) Field of Search ............................... 438/258, 265, 438/266, 267, 302, 525, 528, 532, 594, 595, 659

(56) References Cited

U.S. PATENT DOCUMENTS 5,872,036 A * 2/1999 Sheu .......................... 438/266
6,277,686 B1 * 8/2001 Yeh et al. .................... 438/266
6,420,233 B1 * 7/2002 Hsieh et al. ................. 438/263

OTHER PUBLICATIONS

Wolf, "Silicon Processing for the VLSI Era", 1986, vol. 1, pp. 280–283, 321–322.*

* cited by examiner

Primary Examiner—Chandra Chaudhari
(74) Attorney, Agent, or Firm—Merchant & Gould P.C.

(57) ABSTRACT

A method of fabricating a flash memory cell. The method includes the steps of providing a semiconductor substrate; forming a first gate insulating layer; forming a first conductive layer; forming a barrier layer; removing a portion of the barrier layer to form a first opening; performing an angled implant on the exposed surface of the first conductive layer; forming a floating gate insulating layer; removing the barrier layer; forming a floating gate and a first gate insulating layer; forming a second insulating layer; forming a second conductive layer; removing portions of the second conductive layer and the second insulating layer to form a second opening and a third opening; forming a source region on the substrate; forming spacers on the sidewalls of the second opening and the third opening; and forming drain regions on the substrate within the third opening.

18 Claims, 8 Drawing Sheets

FIG. 2E
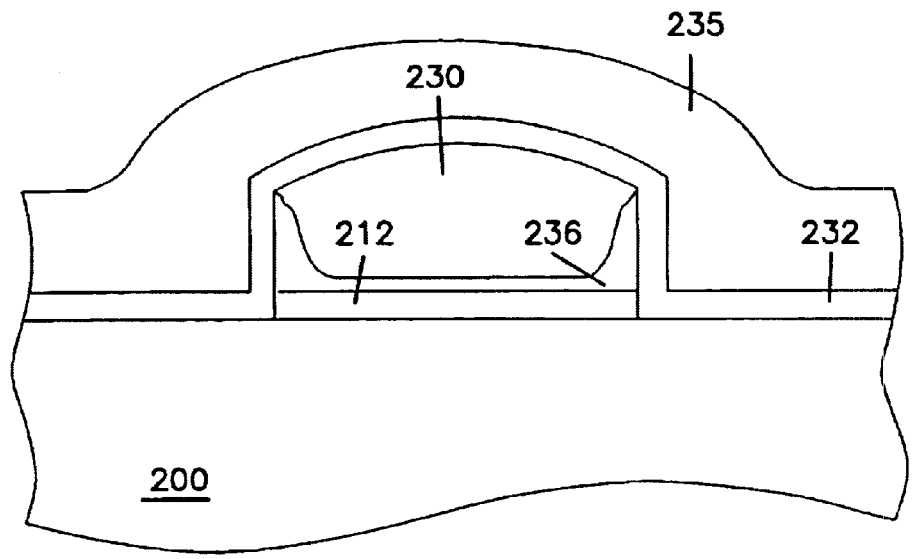
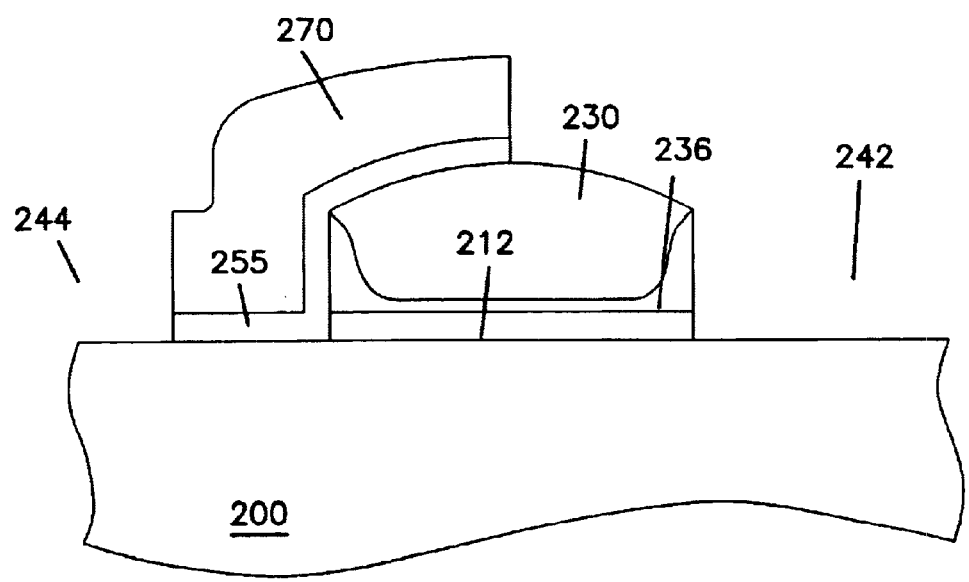
FIG. 2F

METHOD OF FABRICATING A FLASH MEMORY CELL USING ANGLED IMPLANT

BACKGROUND OF THE INVENTION

1. Field of the Invention

The present invention relates to a memory device, and more particularly to the fabrication of a memory cell of a flash memory.

2. Description of the Prior Art

Complementary metal-oxide-semiconductor (CMOS) memory can be divided into two main categories: random access memory (RAM) and read-only memory (ROM). ROM's market share has been continuously growing in the past few years, and further growth in the near future is foreseen, especially for flash memory in which a single cell can be electrically programmable and a block, sector or page of cells that are electrically erasable at the same time. Due to the flexibility of flash memory against electrically programmable read-only memory (EPROM), electrically programmable but erasable via ultraviolet exposure, the market share of flash memory is also experiencing rapid growth. Electrically erasable and programmable read-only memory (EEPROM), electrically erasable and programmable per single byte, will be manufactured for specific applications only, since they use larger area and are more expensive. In recent years, flash memory has found interesting applications in electrical consumer products such as: digital cameras, digital video cameras, cellular phones, laptop computers, mobile MP3 players, and Personal Digital Assistants (PDA's). Since portability of these electrical consumer products is strongly prioritized by consumers, the products' size must be minimal. As a result, the capacity of the flash memory must be enlarged, and functions have to be maximized while size is reduced. The capacity of flash memory has increased from 4 to 256 MB, and will increase to even 1 GB in the near future. With the increase in packing density for flash memory, floating gates and control gates have to be made as small as possible. In conventional processes, masks are usually used to define the gates in flash memory. FIGS. 1A to 1G show the manufacturing processes of a conventional split gate flash memory device.

As shown in FIG. 1A, a semiconductor substrate 100 is provided. An LOCOS Oxidation process is performed to form a field insulating layer (not shown) on the substrate 100. The field insulating layer isolates each active area. A first insulating layer 110 is formed on the substrate 100 within the active area. The first insulating layer 110 can be made of oxide formed by oxidation and has a thickness of from 50 to 200 angstroms. Then, a first conductive layer 115, which has a thickness of about 100 to 2000 angstroms, is formed on the first insulating layer 110. The first conductive layer 115 is usually made of doped polycrystalline silicon formed by chemical vapor deposition (CVD) process. Then, a first masking layer 120, with a thickness of about 500 to 2000 angstroms, is formed on the first conductive layer 115 by depositing a silicon nitride layer.

As shown in FIG. 1B, the first masking layer 120 is removed by performing an etching process to define the first opening 125 and to expose the surface of the first conductive layer 115.

As shown in FIG. 1C, a floating gate insulating layer 130 is formed on the exposed surface of the first conductive layer 115 by an oxidation process. Bird's peaks 137 of the floating gate insulating layer 130 are formed at the tip of the left and right sides of the floating gate insulating layer 130.

As shown in FIG. 1D, the first masking layer 120 is removed by performing an etching process. Then, using the floating gate insulating layer 130 as a hard mask, a portion of the first conductive layer 115 and the first insulating layer 110 are sequentially removed to expose the surface of the substrate 100 by anisotropic etching. The portions of the first conductive layer 115 and the first insulating layer 110 under the floating gate insulating layer 130 remain. The remaining first conductive layer 115 forms a floating gate 136. The remaining first insulating layer 110 will be expressed as a first gate insulating layer 112. Poly tips 138 situated at the tip of the two sides of the floating gate 136 under the bird's peaks 137 are used for tip discharging when flash memory is erasing. Then, a second insulating layer 132 is formed on the surface of the substrate 100, the oxide layer 130, the floating gate 136 and the first gate insulating layer 112. The second insulating layer 132, which has a thickness of about 50 to 250 angstroms, is an oxide and is formed by oxidation or CVD.

As shown in FIG. 1E, a second conductive layer 135 is formed on the second insulating layer 132. The second conductive layer 135 has a thickness of about 1000 to 2000 angstroms and is usually made of the doped polycrystalline silicon formed by CVD.

As shown in FIG. 1F, portions of the second conductive layer 135 and the second insulating layer 132 are removed by photolithography and etching to form a second opening 142 and a third opening 144. The remaining second conductive layer 135 forms the control gate 170. The remaining second insulating layer 132 will be expressed as a second gate insulating layer 155.

As shown in FIG. 1G, a source region 180 is formed on the exposed substrate 100 by implanting N-type ions, such as phosphorus or arsenic into the substrate 100, which is exposed in the second opening 142. Then, an oxide layer (not shown) is formed to cover the surface and the sidewalls of the control gate 170, the surface of the floating gate insulating layer 130, the sidewalls of the second gate insulating layer 155, floating gate 136, and the first gate insulating layer 112. Etching is performed to remove portions of the oxide layer and form the sidewall spacers 150 on the sidewalls of the floating gate 136, the first gate insulating layer 112, the control gate 170 and the second gate insulating layer 155. A drain region 190 is formed on the exposed substrate 100 by implanting N-type ions, such as phosphorus or arsenic into the substrate 100, which is exposed in the third opening 144. The manufacture of a cell of flash memory is thus completed.

As memory devices become more integrated, the minimization of feature size of flash memory is needed. The conventional processes for fabricating flash memory usually use an oxidation process to form the floating gate 136, as shown in FIG. 1D. The bird's beaks 137 on the two sides of the floating gate insulating layer 130 are thinner and longer. Using the floating gate insulating layer 130 as a hard mask to form the floating gate 136, the poly tips 138 are formed on the two sides of the floating gate 136 under the bird's beaks 137.

SUMMARY OF THE INVENTION

An object according to the present invention is to provide a method of fabricating a flash memory cell characterized by improvement of tip discharge efficiency.

A method of fabricating a flash memory cell first provides a semiconductor substrate. An active area is defined on the substrate, and a first insulating layer is formed within the active area. A first conductive layer is formed on the first insulating layer. Then, a barrier layer is formed on the first conductive layer. A first opening is formed by removing a portion of the barrier layer. Afterwards, an angled implant is performed on the exposed surface of the first conductive layer. Next, a floating gate insulating layer is formed on the exposed surface of the first conductive layer. The barrier layer is removed by performing an etching process. Then, using the floating gate insulating layer as a hard mask, a portion of the first conductive layer and the first insulating layer are sequentially removed to expose the surface of the substrate. The remaining first conductive layer forms a floating gate. The remaining first insulating layer forms a first gate insulating layer. Then, a second insulating layer is formed on the surface of the substrate, the oxide layer, the floating gate and the first gate insulating layer. A second conductive layer is formed on the second insulating layer. Next, portions of the second conductive layer and the second insulating layer are removed to form a second opening and a third opening. The remaining second conductive layer forms the control gate. The remaining second insulating layer forms a second gate insulating layer. A source region is formed on the exposed substrate by implanting N-type ions into the substrate, which is exposed in the second opening. Then, sidewall spacers are formed on the sidewalls of the floating gate, the first gate insulating layer, the control gate and the second gate insulating layer. Finally, a drain region is formed on the exposed substrate, which is exposed in the third opening.

BRIEF DESCRIPTION OF THE DRAWINGS

The following detailed description, given by way of example and not intended to limit the invention solely to the embodiments described herein, will best be understood in conjunction with the accompanying drawings, in which:

FIGS. 2A through 2G illustrate, in cross section, the process in accordance with the present invention.

DETAILED DESCRIPTION OF THE PREFERRED EMBODIMENTS

Figure 1A:
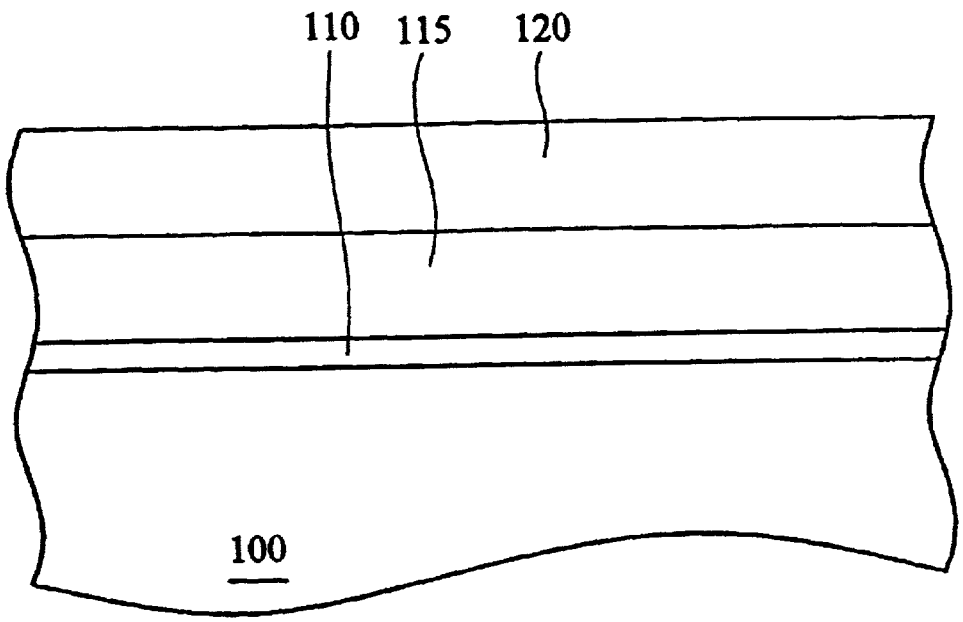
FIGS. 1A through 1G illustrate, in cross section, the process in accordance with a conventional split gate flash memory device.
Figure 1B:
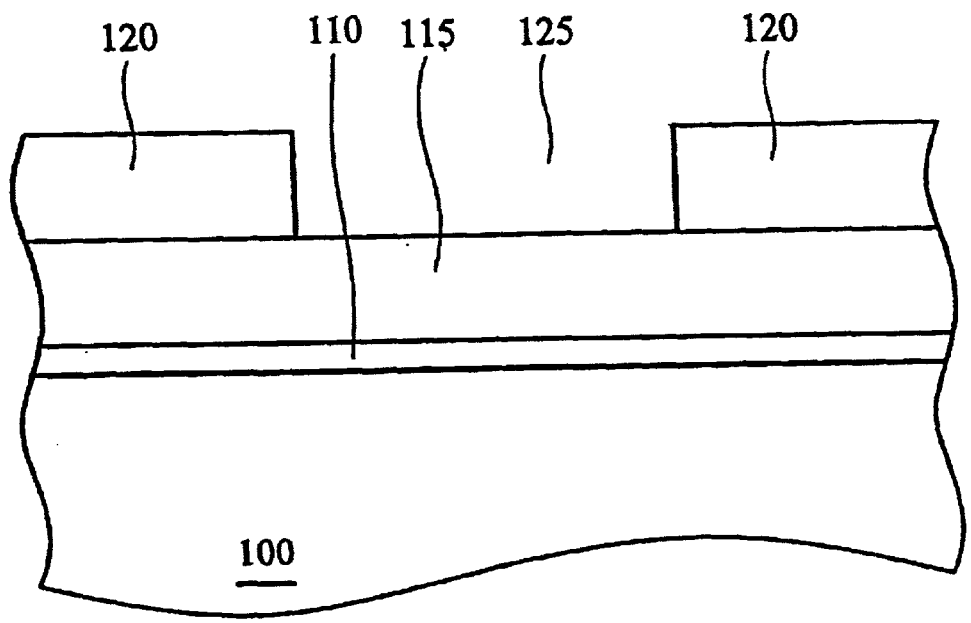
Figure 1C:
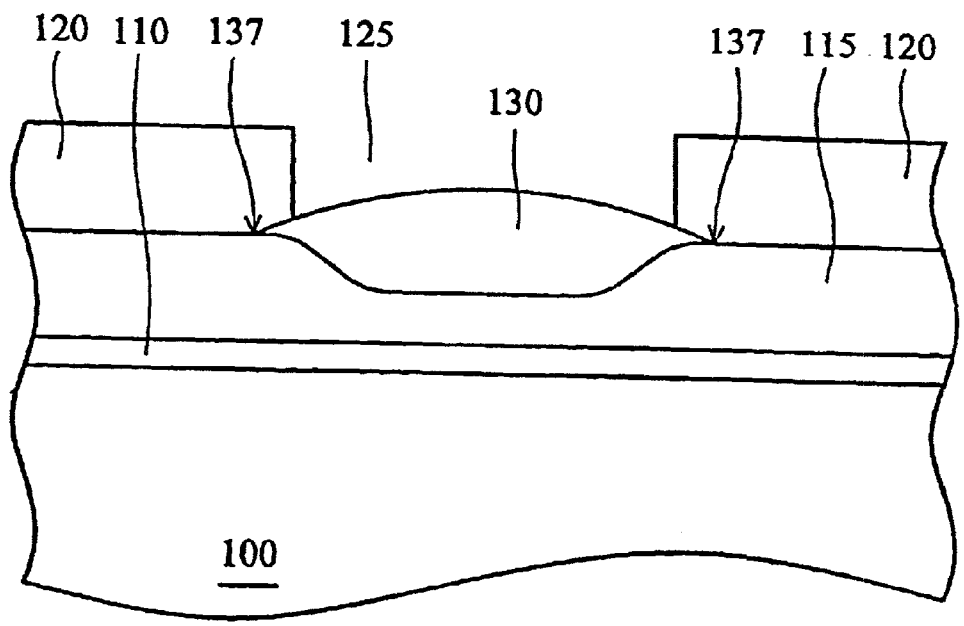
Figure 1D:
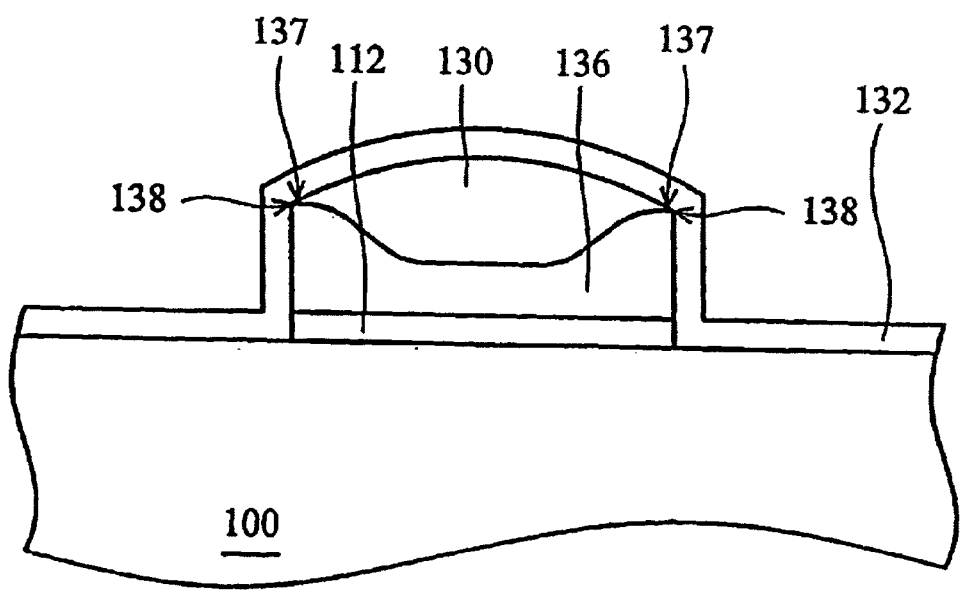
Figure 1E:
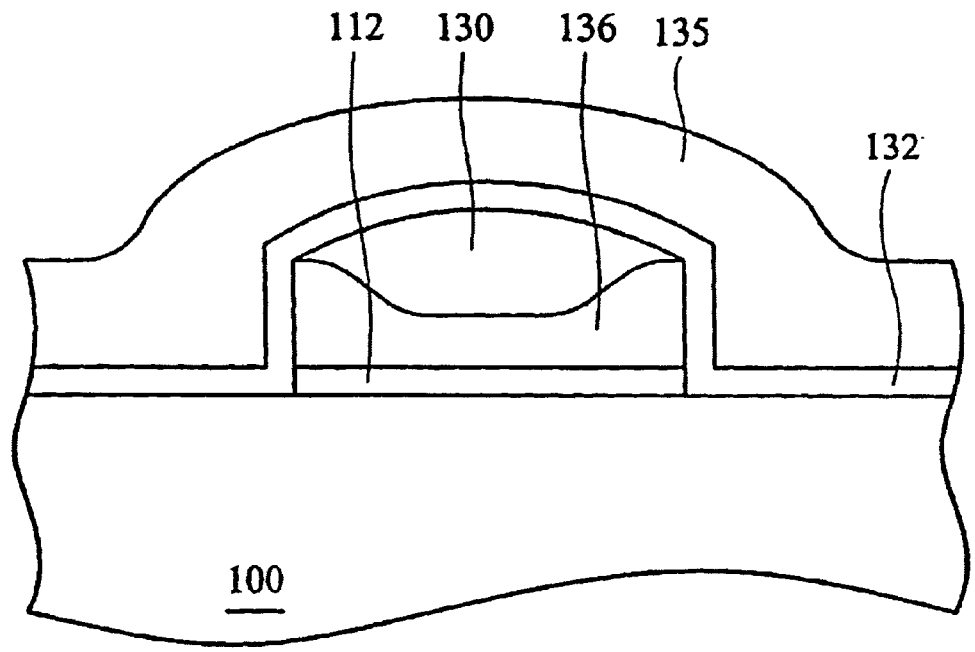
Figure 1F:
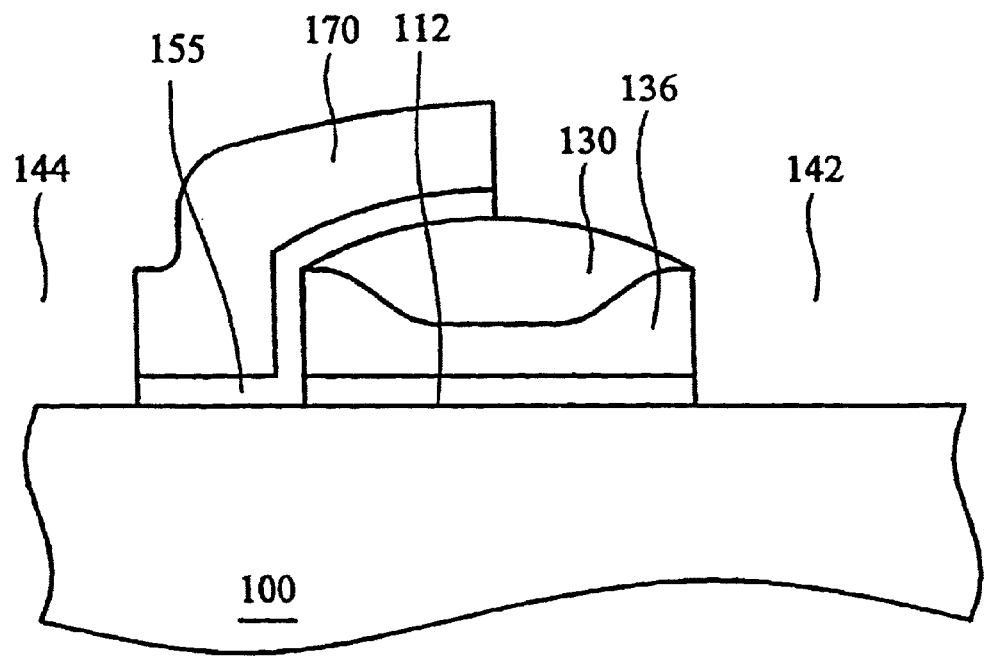
Figure 1G:
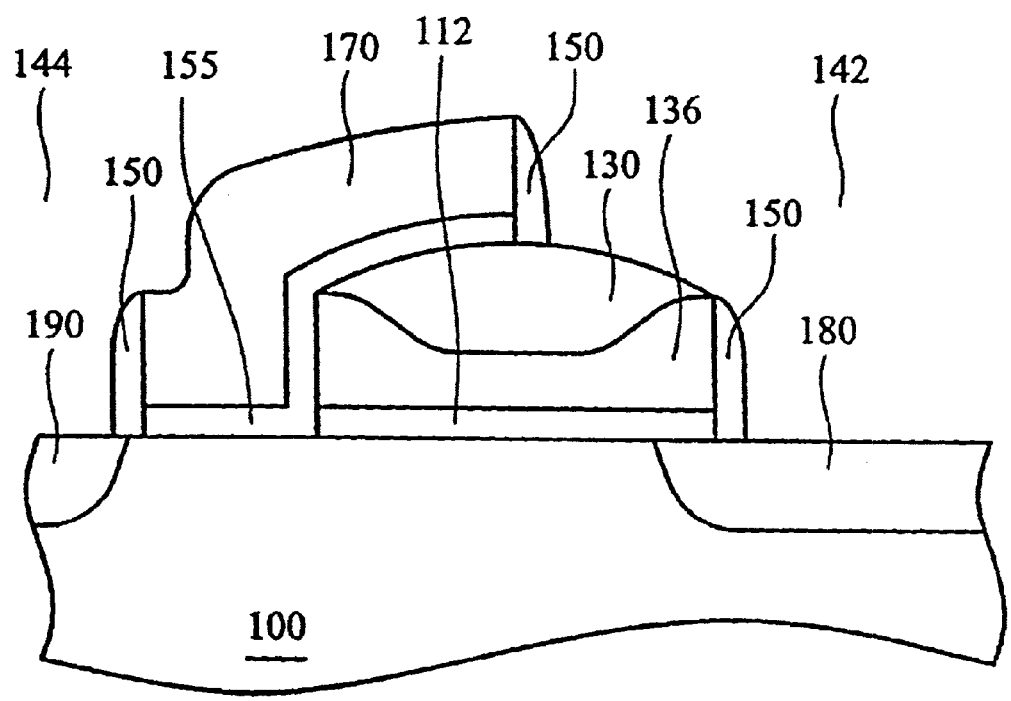
Figure 2A:
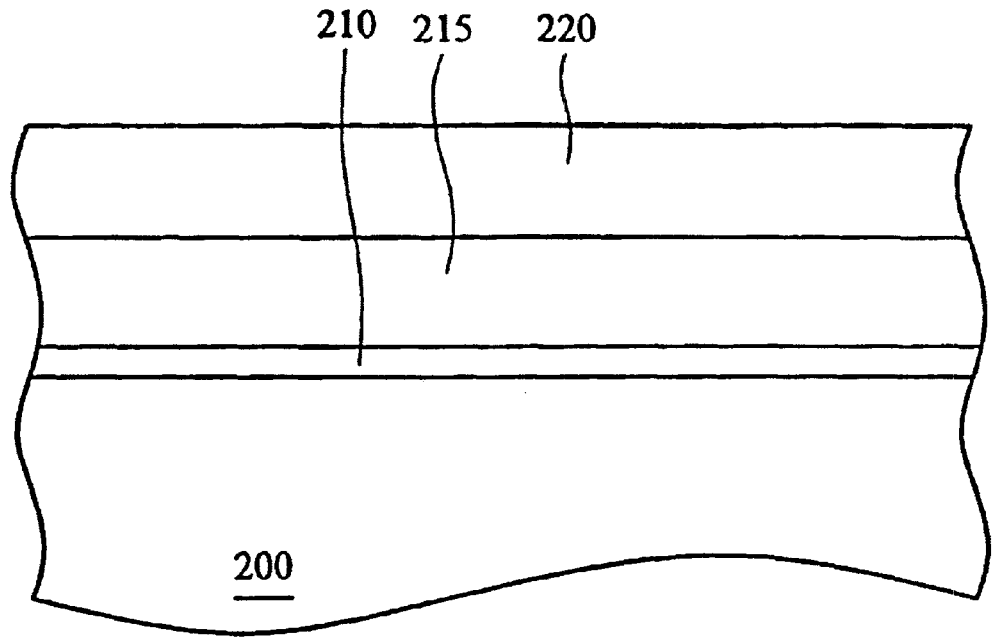

As shown in FIG. 2A, a semiconductor substrate 200, for example, a p-type silicon substrate, is provided. By using LOCOS or STI technique, a field insulating layer (not shown) is formed to define the active area (not shown) on the substrate 200. A first insulating layer 210 is formed on the substrate 200 within the active area. The first insulating layer 210 can be made of oxide formed by oxidation and has a thickness of 50 to 200 angstroms. Then, a first conductive layer 215, which has a thickness of about 100 to 2000 angstroms, is formed on the first insulating layer 210. The first conductive layer 215 is usually made of doped polycrystalline silicon formed by CVD. The first conductive layer 215 can be doped by phosphorus ions or arsenic ions by diffusion, implantation or in-situ doping. A barrier layer 220, with a thickness of about 500 to 2000 angstroms, is formed on the first conductive layer 215. The barrier layer 220 can be made of oxide and is formed by low pressure chemical vapor deposition (LPCVD) or thermal oxidation technique.

Figure 2B:
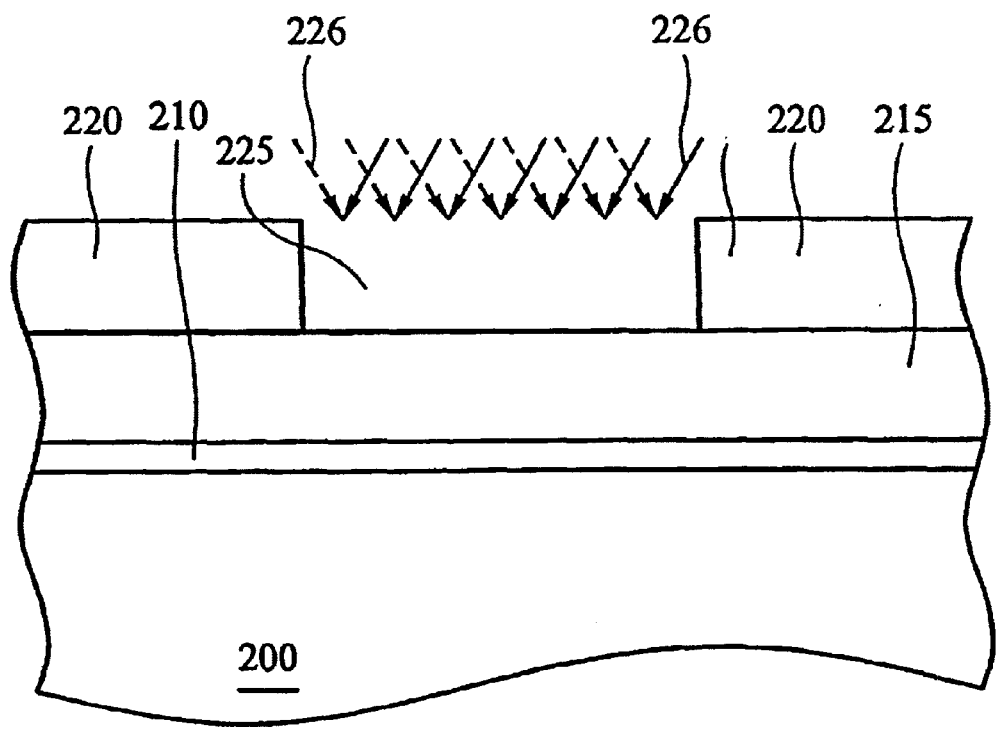

As shown in FIG. 2B, the barrier layer 220 is defined by photolithography and etching. Afterwards, a portion of the by barrier layer 220 is removed to form a first opening 225. An angled implant 226 with phosphorus, arsenic or argon doping is performed on the exposed surface of the first conductive layer 215, as shown in FIG. 2B. Angle of the angled implant 226 can be 0 to 60 degrees. Energy of the angled implant 226 is between 20 and 200 KeV depending on the doping species. The crystalline structure of the surface of the first conductive layer 215 is damaged by high-speed ion bombardment. The larger of the ion, the greater the depth be damaged. If the first conductive layer 215 is doped by phosphorus ions or arsenic ions by diffusion or implantation to form doped polycrystalline silicon, a species of the angled implant can be argon. If the first conductive layer 215 is doped by in-situ doping to form doped polycrystalline silicon, a species of the angled implant can be phosphorus, arsenic or argon.

Figure 2C:
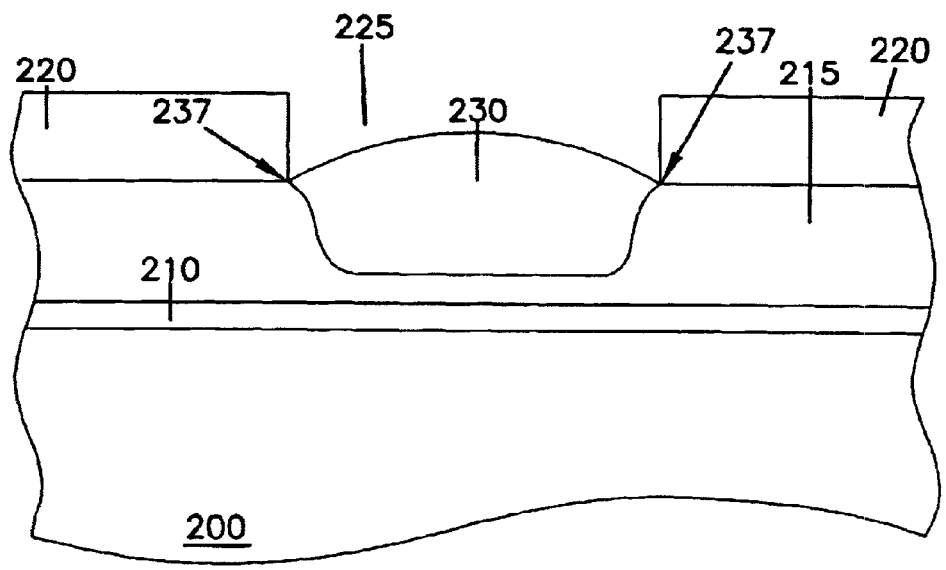

As shown in FIG. 2C, a floating gate insulating layer 230 is formed on the exposed surface of the first conductive layer 215 by an oxidation process. The oxidation can be wet oxidation. Since the crystalline structure of the surface of the first conductive layer 215 is damaged, in the angled implantation step, the oxygen molecules can go deep into the first conductive layer 215 and make the oxidation more complete. Thus, bird's beaks 237 of the floating gate insulating layer 230 are thicker and shorter than those of the prior art.

Figure 2D:
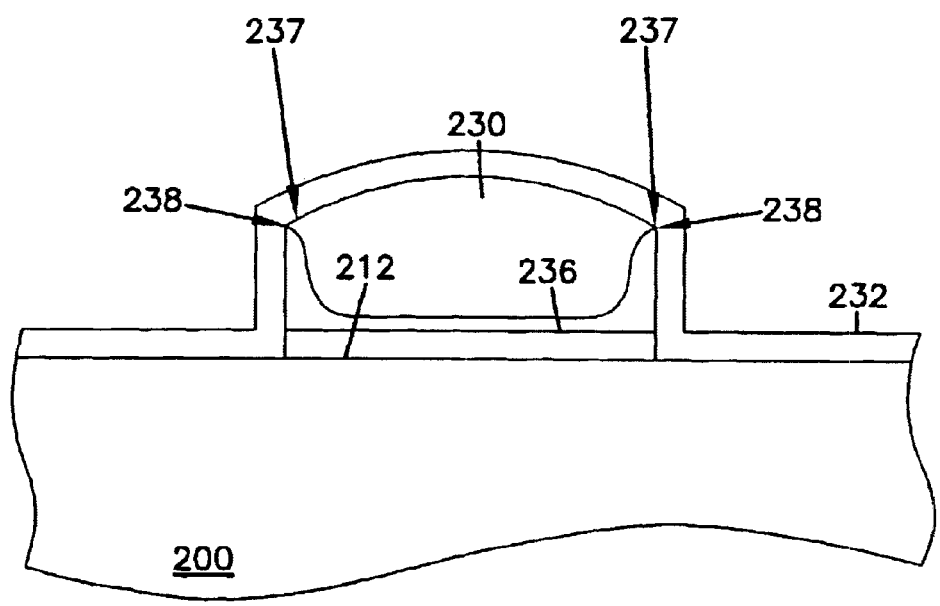

As shown in FIG. 2D, the barrier layer 220 is removed by performing an etching process. Then, using the floating gate insulating layer 230 as a hard mask, a portion of the first conductive layer 215 and the first insulating layer 210 are sequentially removed to expose the surface of the substrate 200 by anisotropic etching. The portions of the first conductive layer 215 and the first insulating layer 210 under the floating gate insulating layer 230 remain. The remaining first conductive layer 215 forms a floating gate 236. The remaining first insulating layer 210 will be expressed as a first gate insulating layer 212. Poly tips 238 situated at the tip of the two sides of the floating gate 236 under the bird's beaks 237 are used for tip discharging when the flash memory is erasing. The bird's beaks 237 of the floating gate insulating layer 230 are thicker and shorter than those of the prior art, as depicted in FIG. 2C. Thus, the poly tips 238 of the present invention are sharper than those of the prior art, so the poly tips 238 have better discharging efficiency. Then, a second insulating layer 232 is formed on the surface of the substrate 200, the oxide layer 230, the floating gate 236 and the first gate insulating layer 212. The second insulating layer 232, which has a thickness of about 50 to 250 angstroms, is an oxide and is formed by oxidation or CVD.

As shown in FIG. 2E, a second conductive layer 235 is formed on the second insulating layer 232. The second conductive layer 235 has a thickness of about 1000 to 2000 angstroms and is usually made of the doped polycrystalline silicon formed by CVD. The second conductive layer 235 can be doped by the phosphorus ions or arsenic ions by diffusion, implantation or in-situ doping.

As shown in FIG. 2F, portions of the second conductive layer 235 and the second insulating layer 232 are removed by photolithography and etching to form a second opening 242 and a third opening 244. The remaining second conductive layer 235 forms the control gate 270. The remaining second insulating layer 232 will be expressed as a second gate insulating layer 255.

Figure 2G:
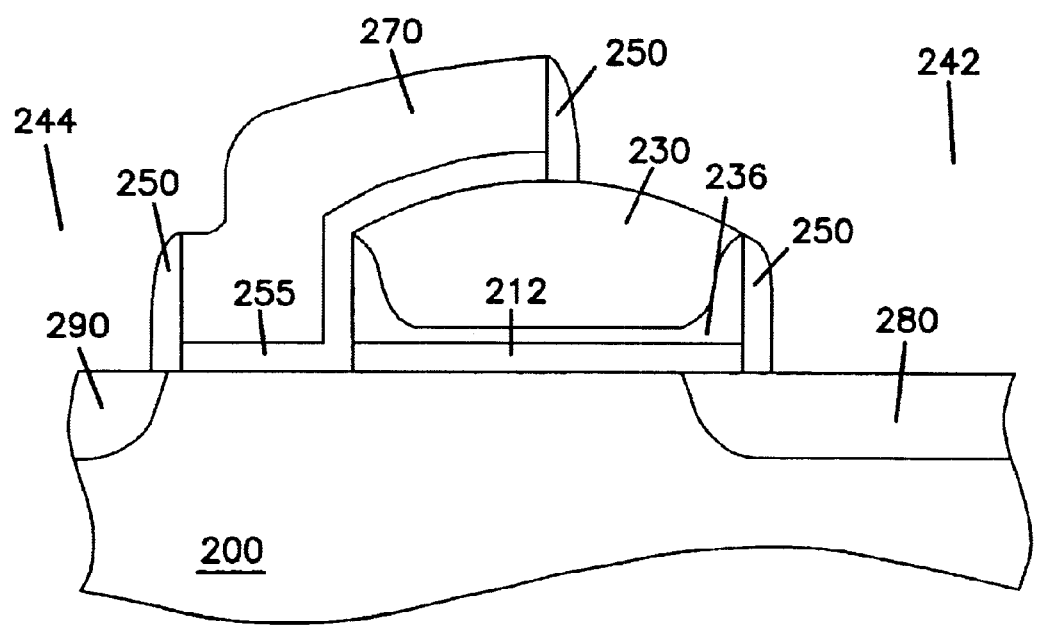

As shown in FIG. 2G, a source region 280 is formed on the exposed substrate 200 by implanting N-type ions, such as phosphorus or arsenic into the substrate 200, which is exposed in the second opening 242. Then, an insulating layer (not shown) is formed to cover the surface and the sidewalls of the control gate 270, the surface of the floating gate insulating layer 230, the sidewalls of the second gate insulating layer 255, floating gate 236, and the first gate insulating layer 212. The insulating layer can be made of an oxide, nitride or oxynitride. Etching is performed to remove portions of the insulating layer and form the sidewall spacers 250 on the sidewalls of the floating gate 236, the first gate insulating layer 212, the control gate 270 and the second gate insulating layer 255. A drain region 290 is formed on the exposed substrate 200 by implanting N-type ions, such as phosphorus or arsenic into the substrate 200, which is exposed in the third opening 244. The manufacture of a cell of flash memory is thus completed.

It is to be understood that the present invention is not limited to the embodiments described above, but encompasses any and all embodiments within the scope of the following claims.

What is claimed is:

1. A method of fabricating a flash memory cell, comprising the steps of:

providing a semiconductor substrate;

defining an active area on the substrate;

forming a first gate insulating layer within the active area;

forming a first conductive layer on the first gate insulating layer;

forming a barrier layer on the first conductive layer;

removing a portion of the barrier layer to form a first opening and expose a portion of the first conductive layer;

performing an angled implant on the exposed surface of the first conductive layer, wherein the angle of implantation is less than 60 degrees relative to a normal to the first conductive layer;

forming a floating gate insulating layer on the exposed surface of the first conductive layer by an oxidation process;

removing the barrier layer;

forming a floating gate and a first gate insulating layer by using the floating gate insulating layer as a hard mask and removing a portion of the first conductive layer and the first insulating layer to expose the surface of the substrate, such that the remaining first conductive layer forms the floating gate and the remaining first insulating layer forms the first gate insulating layer;

forming a second insulating layer on the surface of the substrate, the floating gate insulating layer, the floating gate and the first gate insulating layer;

forming a second conductive layer on the second insulating layer;

removing portions of the second conductive layer and the second insulating layer to form a second opening and a third opening, such that the remaining second conductive layer forms the control gate and the remaining second insulating layer forms the second gate insulating layer;

forming a source region by implanting impurity ions through the second opening into the substrate;

forming spacers on the sidewalls of the second opening and the third opening; and forming a drain regions on the substrate within the third opening.

2. The method as recited in claim 1, wherein the semiconductor substrate is a silicon substrate.

3. The method as recited in claim 1, wherein the first gate insulating layer is made of oxide formed by oxidation.

4. The method as recited in claim 1, wherein the first gate insulating layer has a thickness of 50 to 200 angstroms.

5. The method as recited in claim 1, wherein the first conductive layer is made of doped polycrystalline silicon.

6. The method as recited in claim 1, wherein the first conductive layer has a thickness of 100 to 2000 angstroms.

7. The method as recited in claim 1, wherein the barrier layer is made of oxide.

8. The method as recited in claim 1, wherein the barrier layer has a thickness of 500 to 2000 angstroms.

9. The method as recited in claim 1, wherein the angled implant is accomplished by implanting phosphorus, arsenic or argon.

10. The method as recited in claim 1, wherein the angled implant further comprises energy between 20 and 200 KeV.

11. The method as recited in claim 1, wherein the second insulating layer is made of oxide formed by chemical vapor deposition (CVD).

12. The method as recited in claim 1, wherein the second insulating layer has a thickness of 50 to 250 angstroms.

13. The method as recited in claim 1, wherein the second conductive layer is made of doped polycrystalline silicon.

14. The method as recited in claim 1, wherein the second conductive layer has a thickness of 1000 to 2000 angstroms.

15. A method of fabricating a flash memory cell, comprising the steps of:

providing a semiconductor substrate;

defining an active area on the substrate;

forming a first gate insulating layer within the active area;

forming a first conductive layer on the first gate insulating layer;

forming a barrier layer on the first conductive layer;

removing a portion of the barrier layer to form a first opening and expose a portion of the first conductive layer;

performing an angled implant on the exposed surface of the first conductive layer to damage the crystalline structure of the surface of the first conductive layer. wherein the angle of implantation is less than 60 degrees relative to a normal to the first conductive layer;

forming a floating gate insulating layer on the exposed surface of the first conductive layer by an oxidation process;

removing the barrier layer;

forming a floating gate and a first gate insulating layer by using the floating gate insulating layer as a hard mask and removing a portion of the first conductive layer and the first insulating layer to expose the surface of the substrate, such that the remaining first conductive layer forms the floating gate and the remaining first insulating layer forms the first gate insulating layer;

forming a second insulating layer on the surface of the substrate, the floating gate insulating layer, the floating gate and the first gate insulating layer;

forming a second conductive layer on the second insulating layer;

removing portions of the second conductive layer and the second insulating layer to form a second opening and a third opening, such that the remaining second conductive layer forms the control gate and the remaining second insulating layer forms the second gate insulating layer;

forming a source region by implanting impurity ions through the second opening into the substrate;

forming spacers on the sidewalls of the second opening and the third opening; and forming a drain regions on the substrate within the third opening.

16. The method as recited in claim 15, wherein the first conductive layer is made of doped polycrystalline silicon.

17. The method as recited in claim 15, wherein the angled implant is accomplished by implanting phosphorus, arsenic or argon.

18. The method as recited in claim 15, wherein the angled implant further comprises energy between 20 and 200 KeV.

* * * * *